United States Patent [19]

Knight

[11] Patent Number: 4,541,893
[45] Date of Patent: Sep. 17, 1985

[54] PROCESS FOR FABRICATING PEDESTAL INTERCONNECTIONS BETWEEN CONDUCTIVE LAYERS IN AN INTEGRATED CIRCUIT

[75] Inventor: Colin W. T. Knight, Los Altos Hills, Calif.

[73] Assignee: Advanced Micro Devices, Inc., Sunnyvale, Calif.

[21] Appl. No.: 610,450

[22] Filed: May 15, 1984

[51] Int. Cl.[4] .................. C23F 1/02; B44C 1/22; C03C 15/00; C03C 25/06
[52] U.S. Cl. .................... 156/643; 29/591; 156/646; 156/652; 156/653; 156/656; 156/657; 156/659.1; 204/192 E; 357/71; 427/89; 430/317; 430/318
[58] Field of Search ............... 156/643, 646, 650–653, 156/656, 657, 659.1, 662, 661.1; 204/192 E; 29/580, 591; 427/88–90, 91; 430/313, 314, 316, 317, 318; 357/65, 71

[56] References Cited

U.S. PATENT DOCUMENTS 4,029,562 6/1977 Feng et al. .................. 156/656 X
4,396,458 8/1983 Platter et al. .................. 156/643

OTHER PUBLICATIONS

J. R. Kitcher, "Integral Stud for Multilevel Metal", *IBM Technical Disclosure Bulletin*, vol. 23, No. 4, p. 1395, Sep. 1980.
I. E. Magdo, et al., "Self-Aligned ROI to SAM Structure", *IBM Technical Disclosure Bulletin*, vol. 24, No. 10, pp. 5115–5118, Mar. 1982.
P. W. Betsz, et al., "Self-Aligned Contact Holes", *IBM Technical Disclosure Bulletin*, vol. 24, No. 9, pp. 4643–4644, Feb. 1982.
H. W. Lehmann, et al., "Dry Etching for Pattern Transfer", *J. Vacuum Science and Technology*, vol. 17, No. 5, Sep./Oct. 1980, p. 1177.
D. N. K. Wang, et al., "Reactive-Ion Etching Eases Restrictions on Materials and Feature Sizes", *Electronics*, Nov. 3, 1983, p. 157.
L. M. Ephrath, "Reactive-Ion Etching for VLSI", *IEEE Transactions on Electron Devices*, vol. ED-28, No. 11, Nov. 1981, p. 1315.

Primary Examiner—William A. Powell
Attorney, Agent, or Firm—Patrick T. King; Eugene H. Valet

[57] ABSTRACT

A process for fabricating pedestal interconnections between conductive layers in an integrated circuit includes the steps of (a) forming a first conductive layer over a semiconductor substrate; (b) applying a stop etch layer to said first conductive layer, the stop etch layer having a different etch property than the first conductive layer; (c) patterning the first conductive layer and the stop etch layer in an interconnection pattern which includes widened regions wherever a pedestal interconnection is to be formed; (d) selectively etching the stop etch layer until the stop etch layer remains as a stop etch cap only in central sections of the widened regions; and (e) selectively etching the first conductive layer to a selected depth whereby a pedestal is formed underneath the stop etch caps. The following optional steps may be added: (f) applying a layer of an insulating material over the first conductive layer; and (g) planarizing the insulating layer to expose the tips of the pedestals.

15 Claims, 24 Drawing Figures

PROCESS FOR FABRICATING PEDESTAL INTERCONNECTIONS BETWEEN CONDUCTIVE LAYERS IN AN INTEGRATED CIRCUIT

BACKGROUND OF THE INVENTION

1. Field of the Invention

This invention relates to a process for forming interconnections between conductive layers in an integrated circuit and, more particularly, relates to the process for forming conductive interconnections between separate conductive layers in an integrated circuit without having to open up and fill vias.

2. Discussion of Background and Prior Art

As the densities of integrated circuits increase, it has become necessary to use two or more conductive layers in an integrated circuit in order to make all the electrical interconnections required between the electrically active regions. The conductive layers may be a metal such as tungsten, aluminum, silicides, doped polycrystalline silicon or a composite material such as aluminum-copper-silicon. These conductive layers have necessarily been separated by insulating layers in order to prevent shorting. At times, in accordance with patterns of electrical interconnection it is necessary to interconnect these spaced apart, overlying conductive layers. The heights of the interconnections or pedestals would vary from about 0.8 $\mu$m to 3.0 $\mu$m with taller pedestals being employed for higher current densities and higher level interconnections.

The conventional approach to forming interconnections has been to pattern the intervening insulating layer in order to identify regions where interconnections are desired. These regions are then opened up by means such as chemical or dry etching. The openings, called vias, are then filled with a conductive material which physically bridges the gap between the underlying and the overlying conductive layer and makes electrical contact between them. Such processes require numerous masks and process steps and do not necessarily produce self-aligned structures. In an attempt to simplify the techniques for forming interconnections between conductive layers, it has been proposed to first form pedestals in the underlying layer on which the overlying layer rests, and thereafter apply an insulating layer and then an overlying conductive layer. For example, in J. R. Kitcher, "Integral Stud for Multilevel Metal", *IBM Technical Disclosure Bulletin*, v. 23, No. 4, p. 1395, September 1980, a layer of stud metal is patterned by photoresist on a magnesium oxide mask. Metal studs are then formed by reactive ion etching, followed by application of an insulating layer, planarization to expose the tips of the studs and finally the application of a second conductive layer which contacts the tips of the studs. For this process a separate masking step is required to expose the studs and dimensional allowance must be made for any misalignment of the pedestals with respect to the first conductive layer.

Self-alignment is a preferred condition when overlying layers are fabricated. When the structural features on a given layer are in self-alignment with overlying or underlying layers, the size of the features may be reduced since it is not necessary to oversize the features to compensate for margins of error in alignment. Thus, more devices may be fabricated per unit area. The desirability of self-aligned processes and the various techniques for achieving self-alignment are known in the semiconductor processing art. See, e.g., I. E. Magdo et al., "Self-Aligned ROI to SAM Structure", *IBM Technical Disclosure Bulletin*, v. 24, no. 10, pp. 5115–5118, March 1982; and P. W. Betz et al., "Self-Aligned Contact Holes", *IBM Technical Disclosure Bulletin*, v. 24, no. 9, pp. 4643–4644, February 1982.

Selective etching is a useful process technique in the semiconductor industry. By selective etching is meant an etch which etches one material preferentially to another material. By the use of this technique, it is possible to enhance structural complexity without having to utilize additional masking steps. This is desirable because separate masks and the associated processing steps reduce yield and add to the cost of processing. Selective etching has been used, for example, in conjunction with reactive ion etch equipment. See, e.g., H. W. Lehmann et al., "Dry Etching for Pattern Transfer", *J. Vacuum Science and Technology*, v. 17, No. 5, September/October 1980, pp. 1177. Various etches which have selective etching properties with respect to the several semiconductor materials, e.g., silicon nitride, silicon dioxide, silicon, aluminum alloys, etc., are known in the art. See D. N. K. Wang et al., "Reactive-ion etching eases restrictions on materials and feature sizes", *Electronics*, Nov. 3, 1983, p. 157; and L. M. Ephrath, "Reactive Ion Etching for VLSI", *IEEE Transactions on Electron Devices*, v. ED-28, no. 11, November 1981, p. 1315.

It is therefore an object of the present invention to provide conductive interconnections between conductive layers without having to form openings in intervening insulating layers.

It is another object of the present invention to construct pedestals on an underlying conductive layer which extend up through an insulating layer to contact an overlying conductive layer.

It is another object of the present invention to provide a fabrication process for interconnecting different levels of metallization whereby selective etching is used in lieu of a mask and etch process.

BRIEF DESCRIPTION OF THE DRAWINGS

For a more complete understanding of the process for fabricating pedestal interconnections of the present invention, reference may be had to the accompanying drawings which are incorporated herein by reference and in which:

FIGS. 1–4 depict an abbreviated process sequence illustrating the conventional interconnection scheme of the prior art in which:

FIGS. 5–10 show a process sequence illustrating a technique of the prior art to form pedestals in the underlying layer which connect with the overlying conductive layer in which:

SUMMARY OF THE INVENTION

A process for fabricating pedestal interconnections between conductive layers in an integrated circuit includes the steps of (a) forming a first conductive layer over a semiconductor substrate; (b) applying a stop etch layer to the first conductive layer, the stop etch layer having a different etch property than the first conductive layer; (c) patterning the first conductive layer and the stop etch layer in an interconnection pattern which includes widened regions wherever a pedestal interconnection is to be formed; (d) selectively etching the stop etch layer until the stop etch layer remains as an stop etch cap only in central sections of the widened regions; and (e) selectively etching the first conductive layer to a selected depth whereby a pedestal is formed underneath the stop etch caps. In many process sequences one or more of the following steps are added: (f) applying a layer of insulating material over the first conductive layer; (g) planarizing the insulating layer to expose the tips of the pedestals; and (h) applying a second conductive layer.

DESCRIPTION OF THE PREFERRED EMBODIMENTS

In processes used for fabricating integrated circuits, it is generally desirable to incorporate features such as self-alignment, reproduceability, short process times, and lowest process complexity, while using a minimum number of masks. It is also desirable to utilize processes with loose tolerances and processes which are forgiving. The prior art processes for interconnecting conductive layers as described in the Background section have generally required more masks than desirable and are additionally undesirable because the more masking steps which are used, the looser the dimensional tolerance in devices. The fabrication process of the present invention produces an interconnection between conductive layers without requiring a via to be opened up and filled in intervening insulation and does not require the use of a mask to define a pedestal which will interconnect the parallel layers. It also enjoys the advantage of avoiding step coverage problems normally associated with metallizing over the steep edges of vias.

Figure 1:
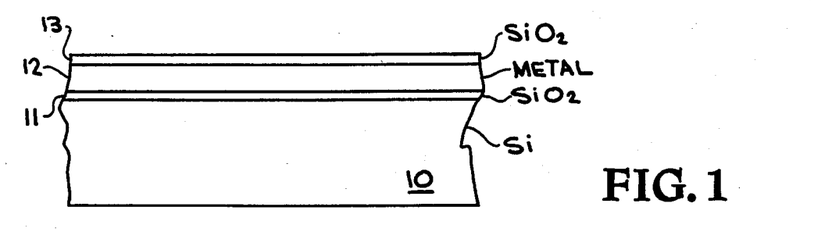
FIG. 1 is a cross-section of a silicon substrate having a first conductive layer applied over an insulating layer.
Figure 2:
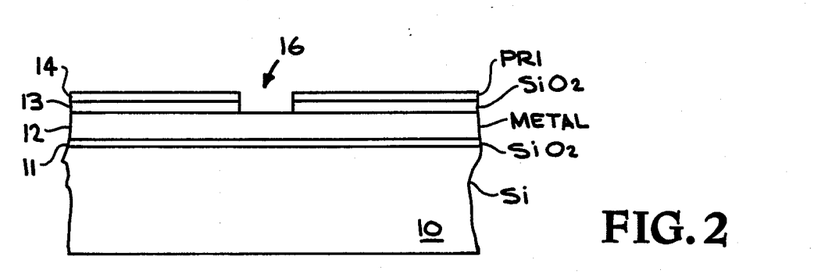
FIG. 2 is a cross-section taken from FIG. 1 after the opening up of via 16 through an intermediate insulating layer.
Figure 3:
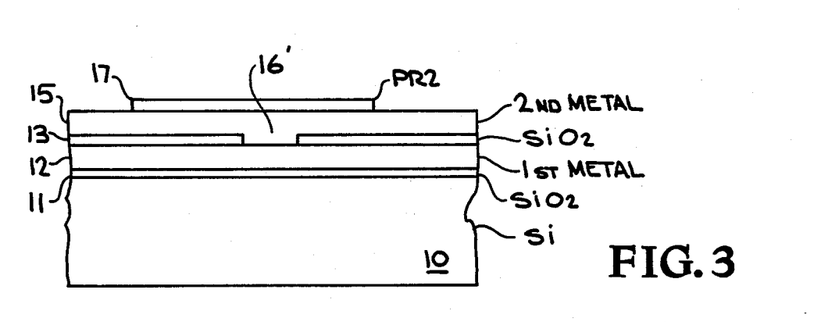
FIG. 3 is a cross-section of FIG. 2 after a second conductive layer and the photoresist for defining the second conductive layer have been applied.
Figure 4:
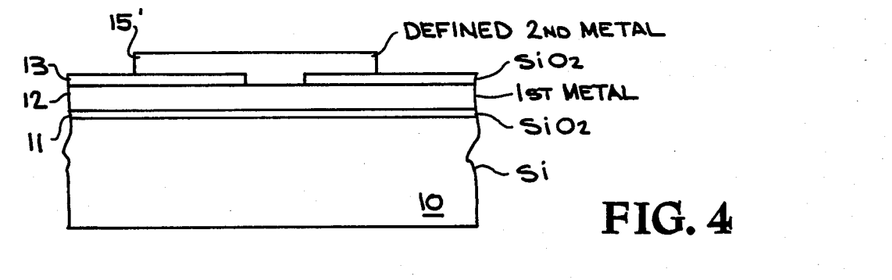
FIG. 4 is a cross-section of FIG. 3 after the second conductive layer has been defined.

The conventional approach to forming a contact between layers is shown in FIGS. 1-4. The first conductive layer 12, shown for purposes of illustration to be a metal, will typically be applied to an insulating layer of silicon dioxide which is grown or deposited onto silicon substrate 10. For the remainder of this specification a silicon system will be described; the process of the invention, however, may be practiced with III–V compounds generally, although the composition of the stop etch layers, conductive layers and selective etches will vary from system to system. As shown in the cross-section of FIG. 1, the first conductive layer 12 blankets the silicon dioxide layer 11; however, in practice the first layer of metal will be defined by a mask (not shown) so that the metal actually overlies only certain portions of the integrated circuit. An insulating layer of silicon dioxde 13 is then applied over the first layer of metal and opened up by means of a photoresist mask, PR1, as shown in FIG. 2, to produce the via 16 wherever conductive interconnections are to be formed. Then, as shown in FIG. 3, a second layer of metal 15 is applied over the surface of silicon dioxide layer 13 after photoresist layer 14 has been stripped. Thus, the second layer of metal 15 makes contact with the first layer of metal 12 as it flows into and fills the via 16 and forms a pedestal region 16' within the via 16. The height of this pedestal will vary from 0.8 $\mu$m to 3.0 $\mu$m. The second layer of metal is then defined by photoresist mask 17, designated PR2. The defined second layer of metal 15' is shown in FIG. 4. The key to this conventional process is that a specific mask PR1 has been used to define the via 16 through which contact is made between second layer metal 15 and first layer metal 12. This extra masking step consumes time, requires additional labor and reduces yield.

Figure 5:
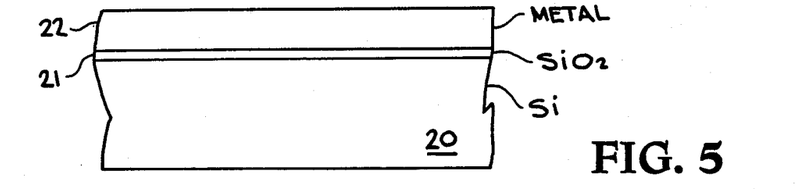
FIG. 5 is a cross-sectional view of a silicon substrate with a first layer of metal applied thereto.
Figure 6:
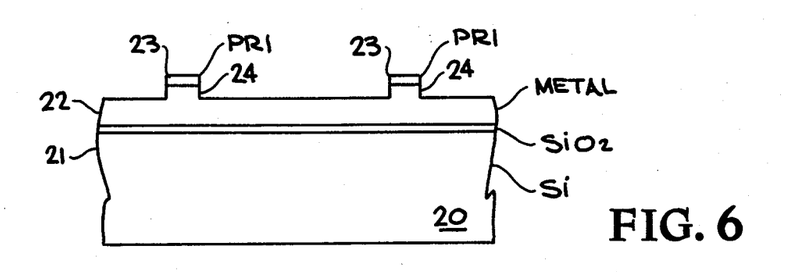
FIG. 6 is a cross-section of FIG. 5 after formation of pedestal in the first layer of metal.
Figure 7:
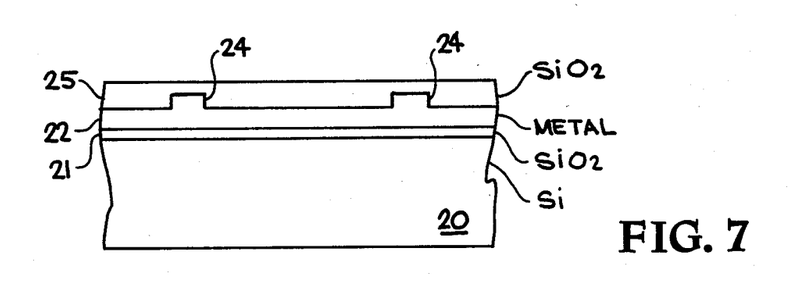
FIG. 7 is a cross-section of FIG. 6 after the application of a covering layer of silicon dioxide over the first layer of metal.
Figure 8:
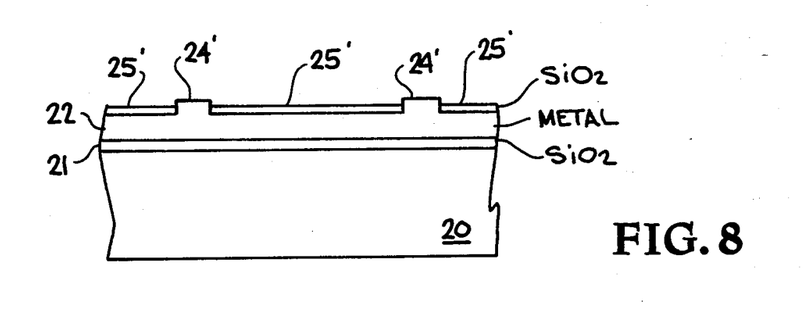
FIG. 8 is a cross-sectional view of FIG. 7 after the covering layer of silicon dioxide has been thinned to expose the tips 24' of pedestals 24.
Figure 9:
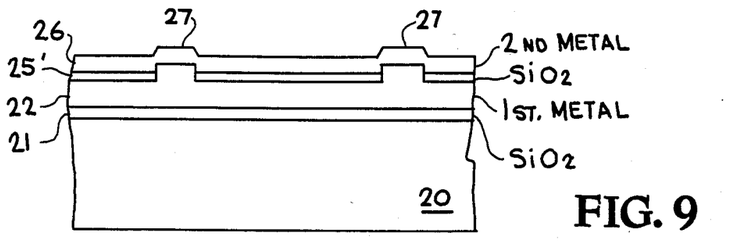
FIG. 9 is a cross-sectional view of FIG. 8 after the application of a second layer of metal.
Figure 10:
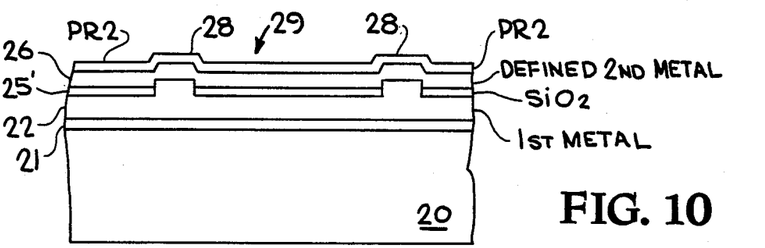
FIG. 10 is a cross-section of FIG. 9 after the definition of the second layer of metal.

A second prior art approach to forming interconnections between overlying conductive layers is shown in FIGS. 5-10. As shown in FIGS. 5-6, pedestals 24 are formed in the upper surface of first layer metal 22 by applying a first photoresist layer 23, designated PR1, and etching the unmasked portions of the surface of the first conductive layer 22. Etching may be accomplished by wet chemical means or by a dry etching technique such as reactive ion etching. This masking step does not use the same mask as would be used to define first layer metal 22 but requires an additional mask. The definition mask for the first conductive layer is not shown in this sequence of figures but would occur before or after the process step of FIG. 6. Then, as shown in FIG. 7, a thick layer 25 of silicon dioxide is applied to the surface of first conductive layer 22 and over protruding pedestals 24. Layer 25 is sufficiently thick to completely cover the upper surfaces 24' of the pedestals 24. The silicon dioxide layer 25 is then selectively etched by an etch such as a plasma mixture of $CF_4$ and $O_2$ which etches silicon dioxide but not metal. It is etched to a level below the upper surfaces 24' of pedestals 24 so they are exposed for subsequent electrical contact. The resulting structure, shown in FIG. 8, contains pedestals 24 in a sea of insulator regions 25'. When a second conductive layer 26, shown for purposes of illustration to be a metal, is applied as shown in FIG. 9, electrical communication is produced between the first conductive layer 22 and the second conductive layer 26. The second conductive layer 26 is deposited conformally so that protrusions 27 extend above the upper surfaces 24' of pedestals 24. Finally, a second photoresist layer 28, designated PR2, serves as a mask to define the second layer metal pattern which includes features such as breaks 29. While the via is not required to be opened by a separate step, the pedestals are defined by a masking step PR1 which is separate from the masking step that defines the first layer of metal.

Figures 11, 12:
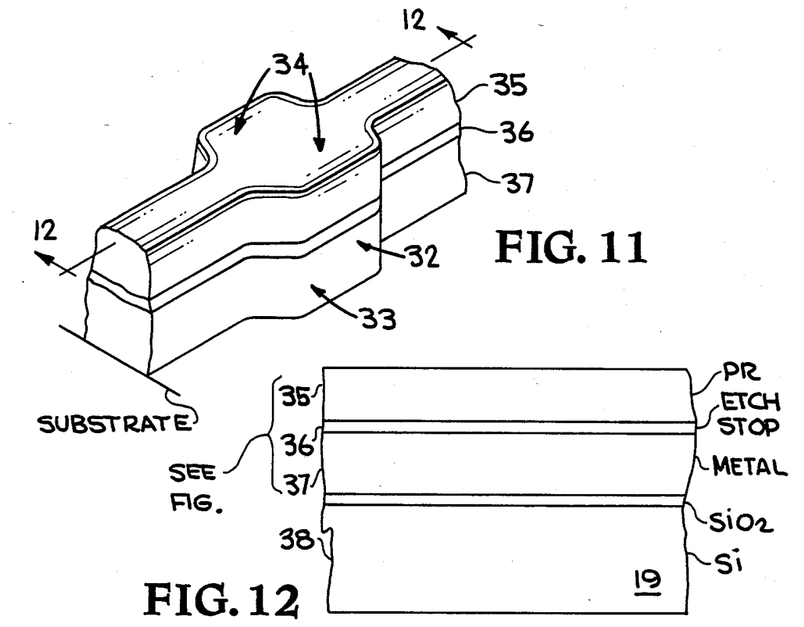
FIG. 11 is a perspective view of a structure having a conductive layer, an overlying stop etch layer and a photoresist layer, all of which in accordance with the present invention have a widened region where a pedestal is to be formed.
FIG. 12 is a cross-sectional view taken through lines 12—12 in FIG. 11.
Figures 13, 14:
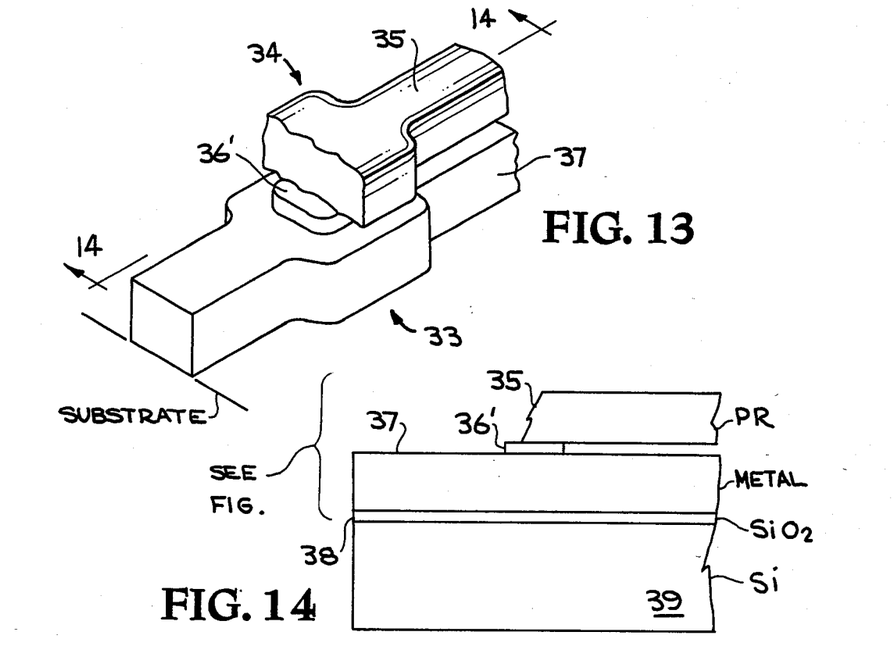
FIG. 13 is a partially broken away perspective view of the layered structure of FIG. 11 after the stop etch region has been selectively etched to leave an stop etch cap over a pedestal region to be formed.
FIG. 14 is a cross-sectional view of FIG. 13 taken through lines 14—14 of FIG. 13.
Figures 15, 16:
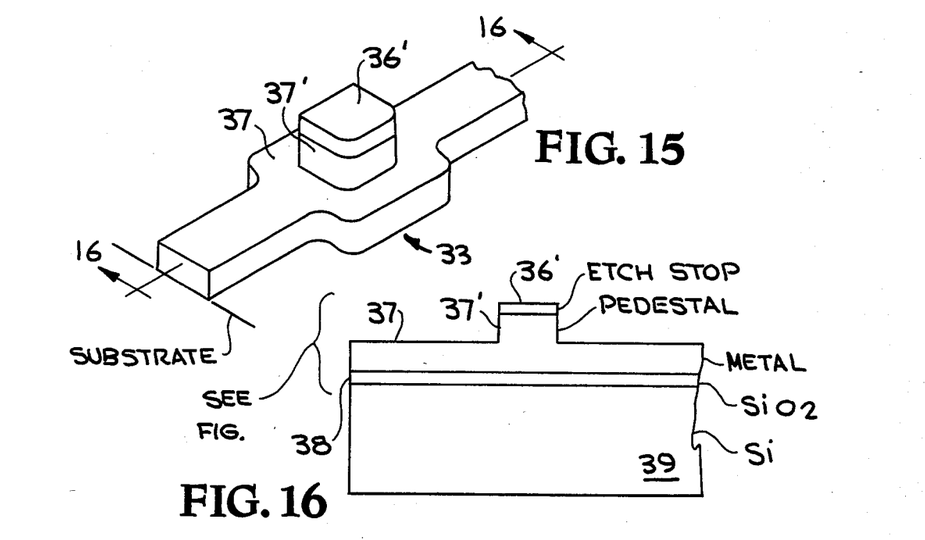
FIG. 15 is a perspective view of FIG. 13 after the conductive layer has been etched everywhere except under the stop etch cap to form a pedestal which stands above a conductive line.
FIG. 16 is a cross-sectional view of FIG. 15 taken through lines 16—16 of FIG. 15.

The fabrication process of the present invention is illustrated in FIGS. 11–20. The objective of the process is the fabrication of pedestals 37', shown in various stages of completion in FIGS. 15–20. The pedestals 37' interconnect a first conductive layer 37 with an overlying conductive layer (not shown) which will overlie dielectric layer 41 when the fabrication sequence is completed and will make contact with the upper surface 37'' of pedestal 37', shown with particularity in FIG. 20. The pedestals 37' are formed without opening up a via and without utilizing a specific mask to define the location and size of the pedestal. The location and size of the pedestal is defined inherently, instead, in the masking step which defines the first conductive layer by varying the widths of the conductive lines, as described in detail subsequently. Briefly, as shown in FIGS. 11, 13 and 15, when the conductive layer 37 is defined, a wider section 34 is provided in the photoresist layer 35 which is used to define the pattern of the first conductive layer; in one embodiment the wider region is twice the normal width of the conductive line. When the first conductive layer is etched, a corresponding wide region 33 is formed in the conductive layer 37 and a corresponding wide region 32 is formed in the intermediate stop etch layer 36 which was provided on top of the surface of conductive layer 37 prior to the application of photoresist layer 35. The composition of stop etch layer 36 is chosen so that there are classes of etches which will etch it and the conductive layer at markedly different rates. For the definition of the wide regions 33 and 32 in the conductive layer 37 and stop etch layer 36 as shown in FIG. 11, an etch is first selected which etches the layers at the same rate. Anisotropic plasma etches such as $CHF_3/O_2$ or $CCl_4$ may be used. Then an etch is selected from the class of differential etches to produce the structure of FIG. 13. Since conductive layer 37 can be a metal, doped polycrystalline silicon or other conductive material, the stop etch layer 36 must be chosen in each instance from a material that has the appropriately different etch properties. The etch that is selected etches stop etch layer 36 much faster than conductive layer 37. If conductive layer 37 is a metal, and intermediate stop etch layer 36 is chosen to be silicon dioxide, a wet buffered HF etch or a plasma etch with species such as $SF_6$, $NF_3$ or $CF_4$ can be used to selectively etch the intermediate etch stop layer. If conductive layer 37 is doped polycrystalline silicon, the intermediate etch stop layer can be chosen to be aluminum and a plasma etch including a chlorine species can be chosen to differentially etch the intermediate stop etch layer 36 at a markedly higher rate than the conductive layer 37.

When an etch is selected that preferentially etches intermediate etch stop layer 36 and is allowed to act for an appropriate time, the conductive layer 37 is left intact and photoresist layer 35 remains in place. The intermediate etch stop layer 36 is etched from the edge inwardly at essentially a uniform rate since either a wet chemical etch or a dry etch with isotropic properties is used. Thus, due to the presence of widened region 32 in the intermediate etch stop layer 36, a centrally located section of the intermediate etch stop layer 36, shown as stop etch cap 36', will remain when the narrower portions have been etched. The shape of widened regions 32, i.e., the length, width and any contours, will determine the shape of the cap 36'. Any arbitrary shape is possible and may be chosen to determine the shape of the pedestal. The thickness will be the original thickness of stop etch layer 36. As shown in FIG. 13, a square shaped cap 36' remains of the intermediate etch stop layer 36 after the rest of the stop etch layer has been etched away. The overlying layer of photoresist 35 necessarily remains in place during the selective etching step but is shown to be broken away for purposes of illustrating the underlying intermediate etch stop section 36'; if the layer was in fact removed then etching would occur in a vertical, not an edgewise, manner and no cap would be produced. As shown in FIG. 14, the photoresist layer 35 will rest on top of the cap 36'. Since multiple pedestals will typically be present across the surface of an integrated circuit, photoresist layer 35 will be supported at many locations. Then, photoresist layer 35 is stripped by conventional means, such as an oxygen plasma or a sulfuric acid/hydrogen peroxide stripping solution. When the photoresist is stripped, the upper surface of conductive layer 37 is exposed except for the area covered by the caps 36'. An etch is now applied which selectively etches the conductive layer 37 over the caps 36' which remain of the original stop etch layer. If the conductive layer 37 is a metal and stop etch layer 36 is silicon dioxide, a suitable etch is a $CCl_4$ plasma etch or ion milling. As a consequence, the caps 36' serve as localized etch stops to prevent the etching of the metal which underlies the caps. The end point of etching is determined by time or specialized stop layers as shown in FIGS. 21–24. Thus, when the end point is reached as shown in FIG. 15, the exposed surface of conductive layer 37 appears below pedestal 37' which is capped by caps 36'. The arrangement of caps 36', pedestal 37' and conductive layer 37 is clearly shown in cross-section in FIG. 16. In one embodiment, the pedestal 37' had a height of 0.5 $\mu m$ out of a total thickness of 1.0 $\mu m$ for the original layer 37.

Figures 17, 18:
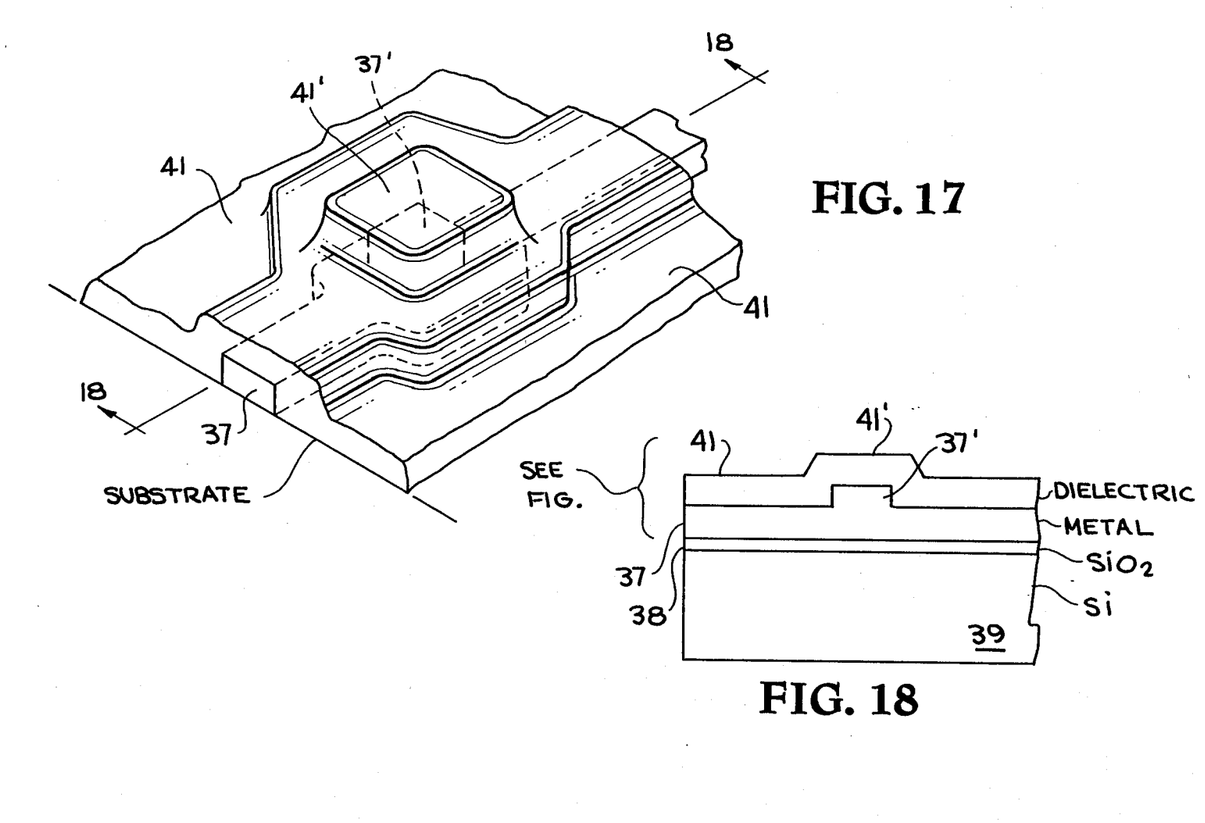
FIG. 17 is a perspective view of the layered structure of FIG. 15 after the application of a blanket layer of silicon dioxide.
FIG. 18 is a cross-sectional view of FIG. 17 taken through lines 18—18 of FIG. 17.
Figure 19:
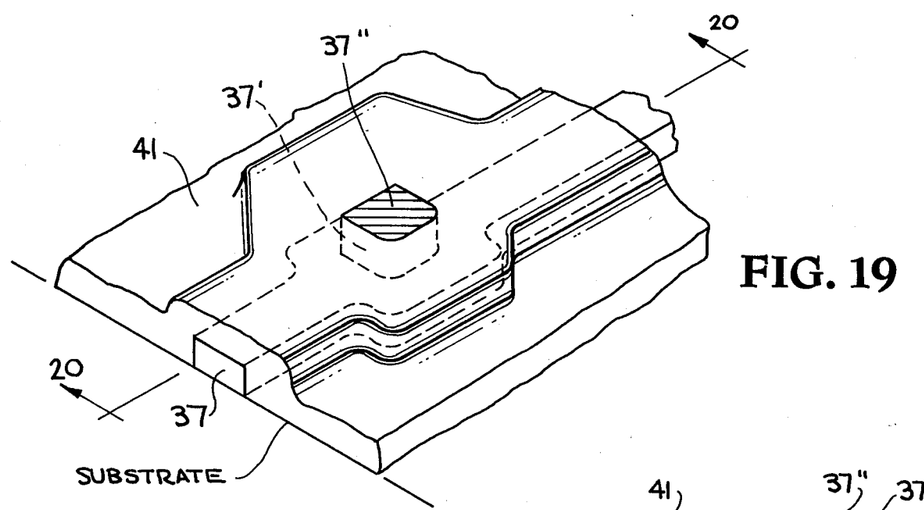
FIG. 19 is a perspective view of FIG. 17 after the planarization of the blanket layer of silicon dioxide to reveal the tip of the pedestal.
Figure 20:
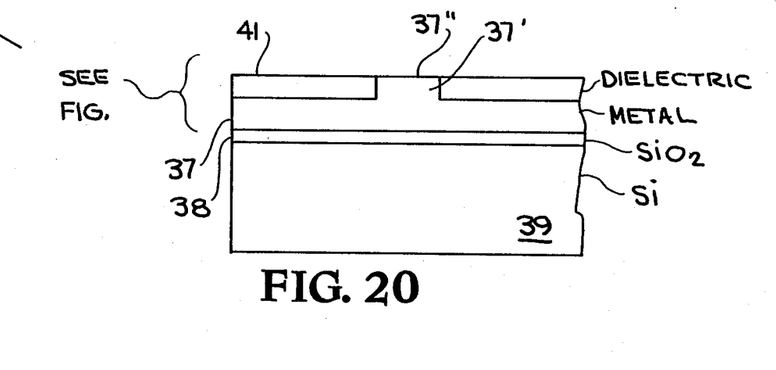
FIG. 20 is a cross-sectional view of FIG. 19 taken through lines 20—20 of FIG. 19.

The dielectric layer 41 which serves to separate the first conductive layer from the second overlying conductive layer is then applied uniformly over the exposed surface of the structure of FIG. 15 as shown in FIGS. 17 and 18. Wherever a pedestal 37' juts above the surface of the first conductive layer 37, a conformal mountain 41' of the dielectric layer can be seen. The surface of dielectric layer 41 is then planarized by using organic coatings and plasma etch processes to produce the planar structure shown in FIGS. 19 and 20. The planarization step exposes the surface 37" of the pedestal 37'. The planarized surface of dielectric layer 41 may be at the same height as the surface 37" of pedestal 37' or may be slightly lower. In the preferred embodiment the surfaces are at the same height in order to present a planar surface to accommodate overlying layers without step heights.

Figure 21:
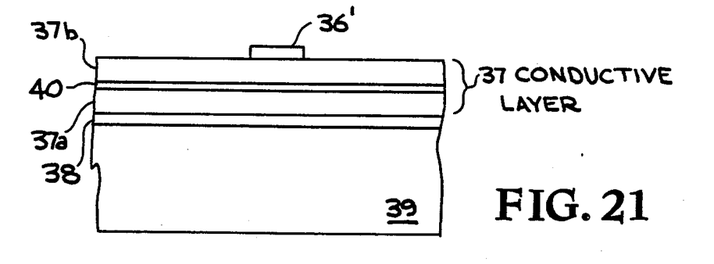
FIGS. 21-22 are successive cross-sectional views of a fabrication process utilizing a first conductive layer composed of sublayers having etch properties different from each other to facilitate the formation of the pedestal.
Figure 22:
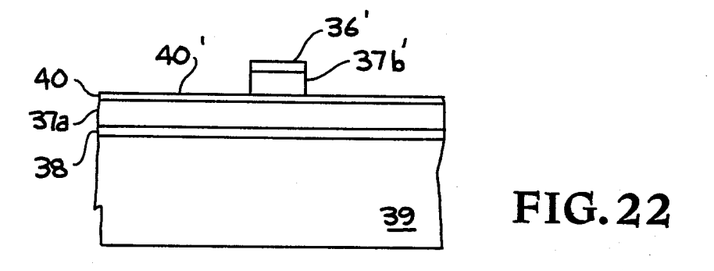
Figure 23:
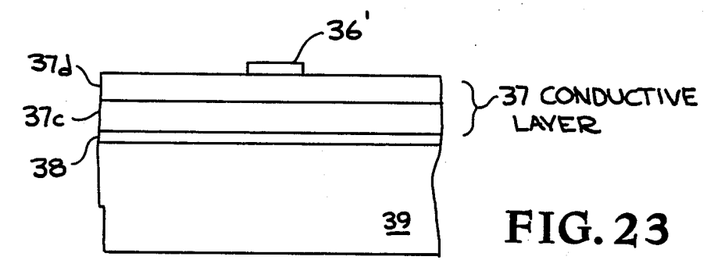
FIGS. 23-24 are successive cross-sectional views of a fabrication process utilizing a first conductive layer composed of two sublayers having differential etch properties.
Figure 24:
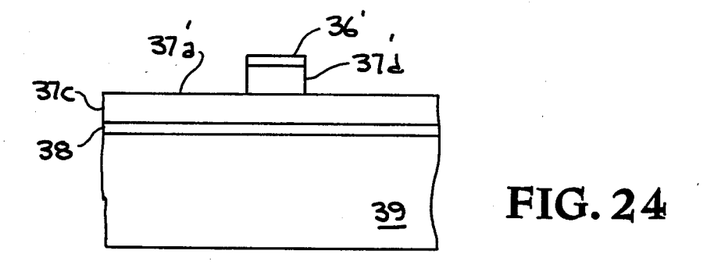

In an alternate embodiment of the fabrication process of the present invention which facilitates the determination of end point for the etching of conductive layer 37, a composite layer is used for the first conductive layer 37. The composite layer may have two regions or may be a sandwich structure. In either case, the sandwich portion or the bottom region must have a differential etch property to the etch property of the upper region. This allows the surface surrounding the base of the pedestal to be planar, providing the lower region is etched at a lesser rate than the upper region. Thus, as shown in the cross-sectional FIGS. 22 and 24, respectively, when the etching process etches through the conductive layer 37 and reaches the sandwich structure 40 or the bottom portion 37c it stops due to the differential etch rate so that the surfaces 40' and 37c' are planar, and the pedestal rises distinctly above the planar surface. Several cross-sectional views which highlight the fabrication sequences are shown in FIGS. 21-22 and 23-24. In FIGS. 21-22 a sandwich structure is used for the first conductive layer; in FIGS. 23-24 a dual metal layer is used for the first conductive layer. For each series of figures the first figure corresponds in terms of the fabrication sequence to the cross-section of FIG. 14 and the second figure corresponds to the cross-section of FIG. 16. In FIG. 21 the first conductive layer 37 is composed of a bottom layer 37a, a sandwich layer 40 and an upper layer 37b. The layers 37a and 37b can, for example, be aluminum and the sandwich layer 40 can be a molybdenum silicide since $MoSi_2$ is more resistant to common etches than aluminum. The pedestal 37b' is formed as before out of the upper layer 37b as shown in FIG. 22. In FIG. 23 a dual layer consisting of a lower layer 37c and an upper layer 37d makes up the first conductive layer 37. The lower layer 37c will have a differential etch property to the upper layer 37d. Thus, when layer 37d is etched, the etch will stop when the surface 37c' of 37c is reached, as shown in FIG. 24. Thus, pedestal 37d" rises abruptly above a precisely planar surface 37c'. This approach is useful because it affords better control over the dimensions of the pedestals.

The foregoing description of a preferred embodiment of the process of the invention has been presented for purposes of illustration and description. It is not intended to be exhaustive or to limit the invention to the precise form disclosed, and obviously many modifications and variations are possible in light of the above teaching. For example, the same process sequence could be applied to forming interconnections between layers in multilayer circuit boards. The semiconductor embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A process for fabricating pedestals to interconnect conductive layers in an integrated circuit formed in a semiconductor substrate, comprising the steps of:
    forming on a semiconductor substrate a first conductive layer with an overlying stop etch layer in an electrical interconnection pattern, said pattern incorporating wider regions at locations where a pedestal is to be formed;
    selectively etching said stop etch layer edgewise with an etch which preferentially etches said stop etch layer in preference to said conductive layer until stop etch caps remain centrally within said widened regions; and
    selectively etching said first conductive layer with an etch which selectively etches said conductive layer in preference to said stop etch layer to form pedestals underneath said stop etch caps.

2. A process for fabricating pedestals in accordance with claim 1 wherein before the step of etching said stop etch layer, the following step is performed:
    applying a masking layer over said stop etch layer to produce said edgewise etching of said stop etch layer.

3. A process for fabricating pedestals in accordance with claim 1 wherein said steps of forming a first conductive layer and applying a stop etch layer are accomplished by the steps of:
    forming a blanket conductive layer;
    applying a stop etch layer over said blanket conductive layer;
    applying a layer of photoresist;
    developing the photoresist layer; and
    etching the exposed regions of stop etch layer and first conductive layer to produce said electrical interconnection pattern.

4. A process for fabricating pedestals in accordance with claim 1 wherein said step of forming a first conductive layer comprises the steps of:
    forming a sublayer of a first conductive material; and
    forming an overlying sublayer of a second conductive material, wherein said first and said second conductive materials have differential etch properties so that the end point of said step of etching said conductive layer may be positively determined.

5. A process for fabricating pedestals in accordance with claim 1 wherein said step of forming said first conductive layer includes the steps of:
    forming a sublayer of a first conductive material;
    forming a thin sandwich layer of a second conductive material; and
    forming a third sublayer of a third conductive material.

6. A process for fabricating pedestals in accordance with claims 1, 2, 3, 4, or 5, wherein the additional step of removing said stop etch cap is accomplished after said step of etching said conductive layer.

7. A process for fabricating pedestals in accordance with claim 6 wherein before said step of forming a first conductive layer the step of forming an insulating layer on said semiconductor substrate is accomplished so that said first conductive layer is formed on said insulating layer.

8. A process for fabricating pedestals in accordance with claim 1 wherein after said step of etching said conductive layer the following steps are accomplished:

applying a blanket layer of insulating material having electrically insulating properties;

planarizing said blanket layer of insulating material to expose the tips of said pedestals; and applying a second conductive layer which selectively contacts said first conductive layer through said pedestals.

9. A process for fabricating pedestals in accordance with claim 1 wherein said step of etching said conductive layer is accomplished by the step of reactive ion etching said first conductive layer.

10. A process for fabricating pedestals to interconnect conductive layers in an integrated circuit formed in a semiconductor substrate, comprising the steps of:

depositing a first conductive layer;

applying a stop etch layer to said first conductive layer;

patterning said first conductive layer and said overlying stop etch layer in a manner such that said first conductive layer and said stop etch layer have widened regions wherever a pedestal is to be formed, said step of patterning including the step of applying a layer of masking material over said stop etch layer;

selectively etching said stop etch layer with an etch which preferentially etches said stop etch layer to said conductive layer, said etching proceeding edgewise into said stop etch layer until stop etch caps are left centrally within said widened regions; and selectively etching said conductive layer with an etch which preferentially etches said conductive layer around said stop etch layer to form a pedestal underneath said sections of said stop etch layer.

11. A process for fabricating pedestals in accordance with claim 10 wherein said step of patterning said conductive layer and said overlying stop etch layer comprises the steps of:

applying a photoresist layer over said stop etch layer in a pattern to positively define a first conductive network to be formed;

developing said photoresist; and etching said stop etch layer and said first conductive layer to produce said conductive network.

12. A process for fabricating pedestals in accordance with claim 11 wherein said steps of etching said stop etch layer and said first conductive layer are accomplished by the step of reactive ion etching.

13. A process for fabricating pedestals in accordance with claim 11 wherein after said step of selectively etching said stop etch layer, the following step is performed:

stripping said photoresist layer.

14. A process for fabricating pedestals in accordance with claim 10 wherein said step of depositing a first conductive layer comprises the steps of:

depositing a sublayer of a first conductive material; and depositing a sublayer of a second conductive material, wherein said first and second materials have differential etch properties so that the end point of said step of etching said conductive layer may be positively determined.

15. A process for fabricating pedestals in accordance with claim 10 wherein said step of depositing said layer of a first conductive material is accomplished by the steps of:

depositing a sublayer of a first conductive material;

depositing a thin sandwich layer of a second conductive material; and depositing a sublayer of a third conductive material, said thin sandwich layer and said sublayer of a thin sandwich material having differential etch properties whereby the end point of said step of etching said first conductive layer may be positively determined.

* * * * *